(12) United States Patent
Bergenek

(10) Patent No.: US 8,692,329 B2
(45) Date of Patent: Apr. 8, 2014

(54) ELECTRIC RESISTANCE ELEMENT SUITABLE FOR LIGHT-EMITTING DIODE, LASER DIODES, OR PHOTODETECTORS

(75) Inventor: Krister Bergenek, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/579,830

(22) PCT Filed: Feb. 1, 2011

(86) PCT No.: PCT/EP2011/051388
§ 371 (c)(1),
(2), (4) Date: Nov. 5, 2012

(87) PCT Pub. No.: WO2011/101238
PCT Pub. Date: Aug. 25, 2011

(65) Prior Publication Data
US 2013/0193454 A1    Aug. 1, 2013

(30) Foreign Application Priority Data
Feb. 19, 2010    (DE) .......................... 10 2010 008 603

(51) Int. Cl.
*H01L 23/62*    (2006.01)
(52) U.S. Cl.
USPC .................. 257/358; 257/536; 257/E29.176; 257/E27.047

(58) Field of Classification Search
USPC ................. 257/169, 358, 359, 489, 516, 536, 257/E29.176, E27.047
See application file for complete search history.

(56) References Cited

U.S. PATENT DOCUMENTS

| | | | |
|---|---|---|---|
| 5,304,838 A * | 4/1994 | Ozawa .......................... 257/542 |
| 6,236,668 B1 | 5/2001 | Osada et al. |
| 2006/0001046 A1 | 1/2006 | Batres et al. |
| 2008/0083929 A1 | 4/2008 | Fan et al. |
| 2011/0291129 A1 | 12/2011 | Wirth |

FOREIGN PATENT DOCUMENTS

| | | |
|---|---|---|
| DE | 10 2008 057 347 | 5/2010 |
| GB | 2 095 474 | 9/1982 |

* cited by examiner

*Primary Examiner* — Hoai V Pham
(74) *Attorney, Agent, or Firm* — Cozen O'Connor

(57) ABSTRACT

An electric resistance element comprising: a base body, which is formed with a semiconductor material; a first contact element, which is electrically conductively connected to the base body; and a second contact element, which is electrically conductively connected to the base body. The base body has a first main surface into which a cutout is introduced. The first contact element is electrically conductively connected to the base body at least in places in the cutout. The base body has a second main surface, which is arranged in a manner lying opposite the first main surface. The second contact element is electrically conductively connected to the base body at least in places at the second main surface.

11 Claims, 3 Drawing Sheets

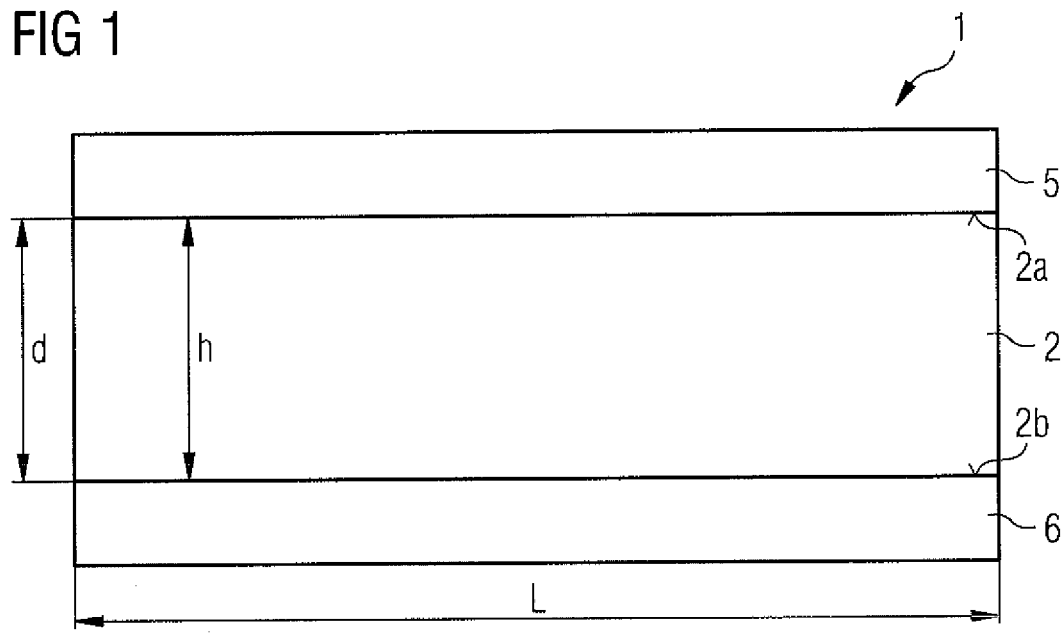
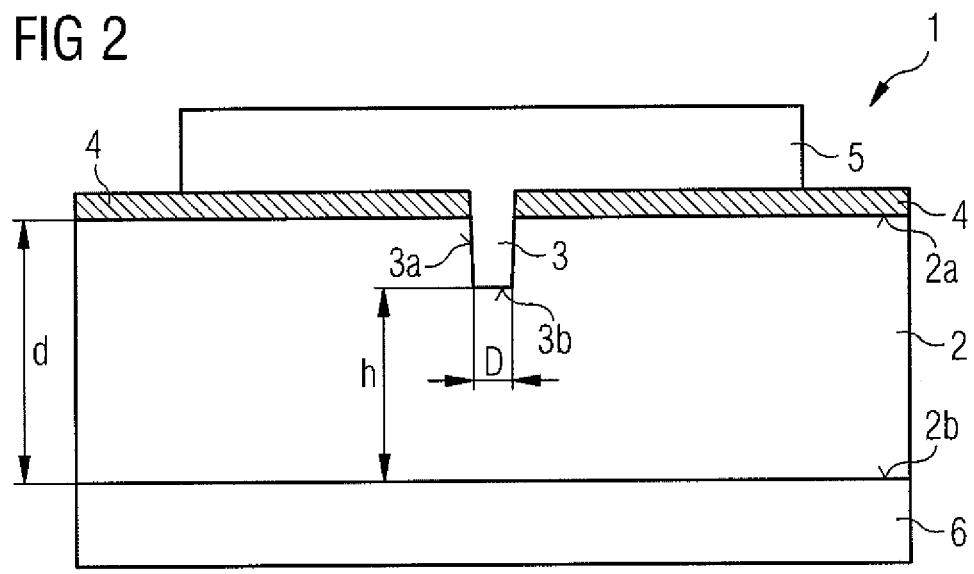

ELECTRIC RESISTANCE ELEMENT SUITABLE FOR LIGHT-EMITTING DIODE, LASER DIODES, OR PHOTODETECTORS

RELATED APPLICATIONS

This application is a U.S. National Phase Application under 35 USC 371 of International Application PCT/EP2011/051388 filed Feb. 1, 2011.

This application claims the priority of German application No. 10 2010 008 603.7 filed Feb. 19, 2010, the entire content of which is hereby incorporated by reference.

FIELD OF THE INVENTION

An electric resistance element is specified.

SUMMARY OF THE INVENTION

One object of the invention is to provide an electric resistance element that is particularly well suited to the use with optoelectronic components such as, for example, light-emitting diodes, laser diodes or photodetectors.

In accordance with at least one embodiment of the electric resistance element, the electric resistance element comprises a base body. The base body is formed with a semiconductor material, for example. That is to say that the base body can consist of a semiconductor material, into which dopants, for example, are introduced. By way of example, the base body consists of an n-doped or a p-doped silicon. However, it is also possible for the base body to have a layer structure, in which, for example, semiconductor materials and metals are arranged one above another in layered fashion.

In accordance with at least one embodiment of the electric resistance element, the resistance element comprises a first contact element. The first contact element is electrically conductively connected to the base body. The contact element consists of an electrically conductive material, for example of a metal. By way of example, the first contact element is embodied as a layer which is applied to the base body in places and follows contours of the base body. The layer can then be in direct contact with the base body.

In accordance with at least one embodiment of the electric resistance element, the resistance element comprises a second contact element, which is electrically conductively connected to the base body. The second contact element can likewise consist of an electrically conductive material such as a metal, for example. The second contact element can be embodied as a layer which is applied on the base body in places in a positively locking manner.

In this case, the first and second contact elements are not directly electrically conductively connected to one another, rather at least the base body of the electric resistance element is arranged between the first and second contact elements. That is to say that a current between the first and second contact elements flows through the base body or through at least parts of the base body.

In accordance with at least one embodiment of the electric resistance element, the base body has a first main surface, into which a cutout is introduced. That is to say that at a first main surface of the base body—for example at a top side of the base body—material of the base body is removed, such that the base body has a hole or an opening there. In this case, the cutout is preferably not embodied in such a way that it reaches from one side of the base body to an opposite side of the base body, rather the cutout merely forms an opening or a hole in the base body which does not completely penetrate through the base body.

In accordance with at least one embodiment of the electric resistance element, the first contact element is electrically conductively connected to the base body at least in places in the cutout. By way of example, at least 85% of the base body can be covered by the contact element in the region of the cutout. In this case, it is possible for the base body to be completely covered by the contact element in the region of the cutout. The contact element can then be situated in the cutout in direct contact with the base body. By way of example, the base body is coated with the material of the first contact element in the region of the cutout.

In accordance with at least one embodiment of the electric resistance element, the base body of the resistance element has a second main surface. The second main surface is arranged, for example, in a manner lying opposite the first main surface. The base body of the electric resistance element can be embodied, for example, in the manner of a cylinder or a cuboid. The main surfaces of the base body are then formed, for example, by the bases or faces of the cylinder or cuboid, respectively.

In accordance with at least one embodiment of the electric resistance element, the second contact element is electrically conductively connected to the base body at least in places at the second main surface. By way of example, the second contact element for this purpose covers the second main surface in places or completely. The second contact element can be applied as a metal layer, for example, to the second main surface of the base body. It is possible, in particular, for the second contact element and the base body to be in direct contact with one another.

In accordance with at least one embodiment of the electric resistance element, the electric resistance element comprises a base body formed with a semiconductor material. Furthermore, the resistance element comprises a first and a second contact element, which are in each case electrically conductively connected to the base body. In this case, the base body has a first main surface, into which a cutout is introduced. The first contact element in the cutout is electrically conductively connected to the base body at least in places. The base body furthermore has a second main surface, which is arranged in a manner lying opposite the first main surface. The second contact element is electrically conductively connected to the base body at least in places at the second main surface.

During the operation of the electric resistance element, an electric current, proceeding from the first contact element, for example, flows through the base body and passes from there into the second contact element. In this case, the cutout in the base body extends, for example, from the first main surface in the direction of the second main surface. On account of the fact that the first contact element is introduced into the cutout and is electrically conductively connected to the base body there, the short-circuit path through the base body between the first contact element and the second contact element is reduced by the cutout. In this way, it is possible to choose a relatively thick, mechanically stable base body in which the short-circuit path through the base body is reduced by the cutout in such a way that the resistance of the resistance element, despite the use of a thick base body, does not become excessively high, in order to be used for example for optoelectronic semiconductor components such as light-emitting diodes. By means of the depth of the cutout, that is to say the distance between first contact element and second contact element or the length of the resultant short-circuit path through the base body, it is possible to set the resistance of the electric resistance element in a simple manner, such that, by way of example, the resistance can be matched to the forward voltage and the brightness of a light-emitting diode chip with which the electric resistance element is used.

In accordance with at least one embodiment of the electric resistance element, an electrically insulating passivation element is arranged between the first main surface and the first contact element. That is to say that, at least in places, the first contact element is not in direct contact with the first main surface of the base body, rather an electrically insulating passivation element is arranged between regions of the first contact element and the first main surface of the base body. The electrically insulating passivation element is an electrically insulating layer, for example, which can be formed from a ceramic material, from silicon nitride or from silicon dioxide.

In accordance with at least one embodiment of the electric resistance element, the first contact element and the base body are electrically conductively connected to one another only in the region of the cutout of the base body. That is to say that only in the region of the cutout there is an electrically conductive contact between the first contact element and the base body. This can be achieved by virtue of the fact that the first contact element is applied to the base body only in the region of the cutout, or that parts of the base body are electrically insulated from the contact element by means of an electrically insulating passivation element. By way of example, the passivation element surrounds the cutout at the first main surface of the base body and the first contact element is applied, at least in places, directly to the passivation element and to the base body in the region of the cutout.

In accordance with at least one embodiment of the electric resistance element, the cutout in the base body has at least one side surface and at least one bottom surface, wherein the at least one side surface and the at least one bottom surface delimit the cutout toward the base body. Toward the top, that is to say in the direction of the first main surface of the base body, the first contact element, for example, is introduced into the cutout. The at least one side surface and the at least one bottom surface can then completely be in direct contact with the first contact element. In other words, the base body exposed in the cutout can be completely covered by the first contact element in the cutout.

In accordance with at least one embodiment of the electric resistance element, the cutout is embodied in the manner of a pyramid whose vertex faces the second main surface. That is to say that the pyramid tapers as seen from the first main surface in the direction of the second main surface. In cross section, the cutout can then have a triangular shape, for example, wherein the vertex of the triangle faces the second main surface of the base body.

In accordance with at least one embodiment of the electric resistance element, the cutout has traces of an etching process at its at least one side surface and its at least one bottom surface. In other words, the cutout is then produced by an etching process. By way of example, the cutout can be produced by a wet-chemical anisotropic etching process using KOH, for example. If the base body is formed with silicon, for example, and if a (100)-surface is exposed at the first main surface, then a pyramidal cutout is produced in the base body by means of a wet-chemical anisotropic etching process. Half the opening angle of the pyramid is then ideally 35.3°. On account of the anisotropic etching, the etching process ends as soon as the pyramid or the pyramidal cutout has formed.

In accordance with at least one embodiment of the resistance element, the resistance element has a positive temperature coefficient. That means that as the temperature of the resistance element increases, the electrical resistance thereof also increases.

In accordance with at least one embodiment of the electric resistance element, the base body consists of a doped silicon that is n- or p-doped. In this case, the dopant concentration is preferably at least $10^{15}$ cm$^{-3}$ and at most $10^{16}$ cm$^{-3}$. A relatively low dopant concentration is desirable in this case in order to achieve a high positive temperature coefficient. Preferably, the resistance of the electrical resistance element increases by a factor of at least 2, preferably of at least 3, in a temperature range of between 25° C. and 150° C. Thus, said factor for a base body composed of silicon is approximately 3.3 for a p-type dopant concentration of $10^{15}$/cm$^3$, approximately 2.9 for a dopant concentration of $10^{16}$/cm$^3$ and approximately 2.2 for a dopant concentration of $10^{17}$/cm$^3$. For a dopant concentration of $10^{18}$/cm$^3$, the factor would only be 1.8, which is too low for the use with light-emitting diode chips, for example.

In accordance with at least one embodiment of the electric resistance element, the base body has a thickness of at least 100 µm. In this case, the thickness is the distance between the first main surface without the cutout and the second main surface. Such thick base bodies with low dopant concentration are made possible in the present case by the cutout, which reduces the short-circuit path between the first contact element and the second contact element to an extent such that the resistance of the electric resistance element is in a range of at most 10Ω, which is desired for example for use with optoelectronic semiconductor components. By way of example, the resistance is at least 3Ω.

In this case, the basic area of the first main surface and/or of the second main surface can be, for example, at most 1 mm$^2$.

A method for producing a multiplicity of electric resistance elements is furthermore specified. Electric resistance elements described here can be produced by the method. That is to say that the features disclosed for the resistance element are also disclosed for the method, and vice versa.

In this case, the method comprises the following steps: firstly, a wafer is provided, which consists of a semiconductor material. The semiconductor material of the wafer forms the base body in the later resistance element.

Afterward, a passivation element is applied to a first main surface of the wafer. The first main surface of the wafer corresponds to the first main surface of the base body later in the resistance element. The passivation element is applied, for example, as a layer composed of an electrically insulating material such as silicon dioxide or silicon nitride. Openings are formed in places in the passivation element, the semiconductor material being exposed in said openings. This can either be done by means of a mask technique, such that the semiconductor material of the wafer is not covered by the passivation element in the region of the openings, or the passivation element is subsequently removed.

This is followed by carrying out a wet-chemical etching method—for example using KOH—onto the semiconductor material exposed in the openings in order to form cutouts.

If, by way of example, a silicon (100)-surface is exposed in the openings, then a pyramidal cutout whose vertex is directed away from the first main surface of the wafer forms as a result of an anisotropic wet-chemical etching method. The height of the pyramid and thus the length of the short-circuit path in the later resistance element is determined by the thickness of the wafer, that is to say the thickness of the later base body, and the diameter of the opening in the passivation element, that is to say the maximum diameter of the later cutout. For a predetermined wafer of uniform thickness, therefore, the resistance of the resistance element to be produced can be set solely by way of the size and shape of the opening. In particular, it is possible to produce resistance elements having different electrical resistances on one wafer, by choosing openings of different sizes in the passivation element.

In a further method step, a first contact element can in each case be introduced into the cutouts formed by the etching process.

In accordance with at least one embodiment of the method, in this case at least two cutouts in the wafer can have a mutually different maximum diameter. That is to say that the associated resistance elements then have a different electrical resistance.

In a further method step, the wafer having the cutouts produced in the wafers can be separated into individual resistance elements. In this case, a second contact element can be applied before or after the singulation.

An illumination device is furthermore specified. The illumination device contains, for example, a plurality of light-emitting diode chips which generate electromagnetic radiation during operation.

In accordance with at least one embodiment of the illumination device, the illumination device comprises a first arrangement of light-emitting diodes, which comprises at least one light-emitting diode of a first type. By way of example, the first arrangement comprises one or a plurality of light-emitting diode chips that emit red light.

The illumination device furthermore comprises a second arrangement of light-emitting diodes, which comprises at least one light-emitting diode of a second type. By way of example, the second arrangement comprises one or a plurality of light-emitting diode chips that emit green or blue light during operation. In this case, the light-emitting diodes of a first type and the light-emitting diodes of a second type differ with regard to their temperature dependence. The light-emitting diodes of a first type generate electromagnetic radiation with lower efficiency than the light-emitting diodes of a second type in the case of rising temperatures. In other words, the light-emitting diodes of a first type are more temperature-sensitive than the light-emitting diodes of a second type, and the intensity of the light emitted by the light-emitting diodes of a first type decreases to a greater extent than in the case of the light-emitting diodes of a second type with rising temperatures.

The illumination device furthermore comprises a resistance element described here. In this case, the second arrangement of light-emitting diodes and the resistance element form a series circuit, and the series circuit together with the first arrangement of light-emitting diodes forms a parallel circuit.

That is to say that the less temperature-sensitive light-emitting diodes are combined with the resistance element in a series circuit, with which the more temperature-sensitive light-emitting diodes are connected in parallel. Such an illumination device can generate mixed light of the mixed light emitted by the first arrangement of light-emitting diodes and the second arrangement of light-emitting diodes with particularly high color homogeneity. During the operation of the illumination device, with higher temperatures the resistance of the resistance element increases, such that more voltage is dropped across the resistance element and less voltage is dropped across the light-emitting diodes of a second type. In this case, the resistance and also the positive temperature coefficient of the resistance element are coordinated in such a way that the resulting decrease in the radiation power of the light-emitting diodes of a second type, on account of the power drop at the resistance element, corresponds to the reduced radiation power of the light-emitting diodes of a first type, which emit electromagnetic radiation of reduced intensity on account of their increased temperature sensitivity.

BRIEF DESCRIPTION OF THE DRAWINGS

Electric resistance elements described here, methods described here and illumination devices described here are explained in greater detail below on the basis of exemplary embodiments and the associated figures.

With reference to the schematic sectional illustration in FIG. 1, a problem underlying an electric resistance element described here is explained in greater detail.

With reference to the schematic sectional illustration in FIG. 2, a first exemplary embodiment of an electric resistance element described here is explained in greater detail.

Figure 3:
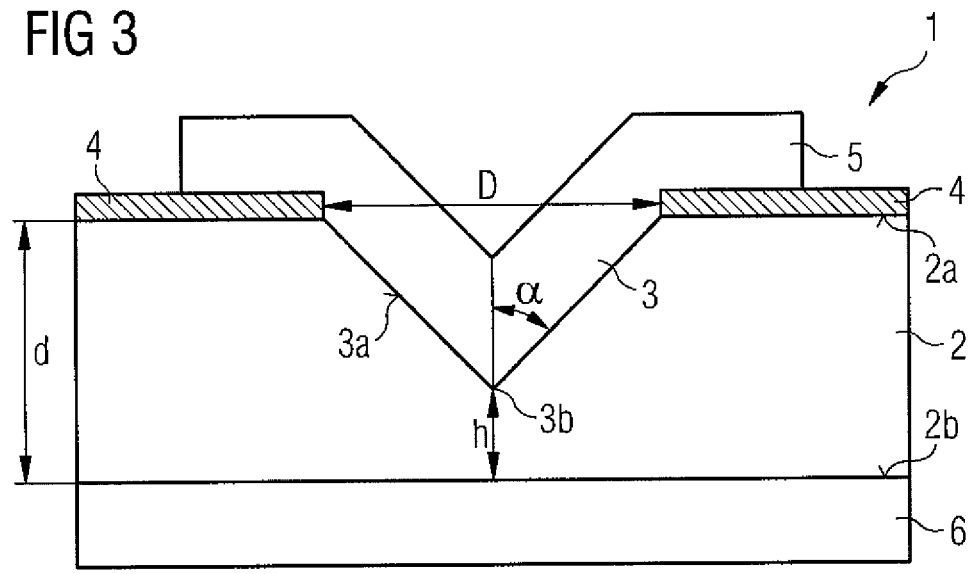

With reference to the schematic sectional illustration in FIG. 3, a second exemplary embodiment of an electric resistance element described here is explained in greater detail.

Figure 4:
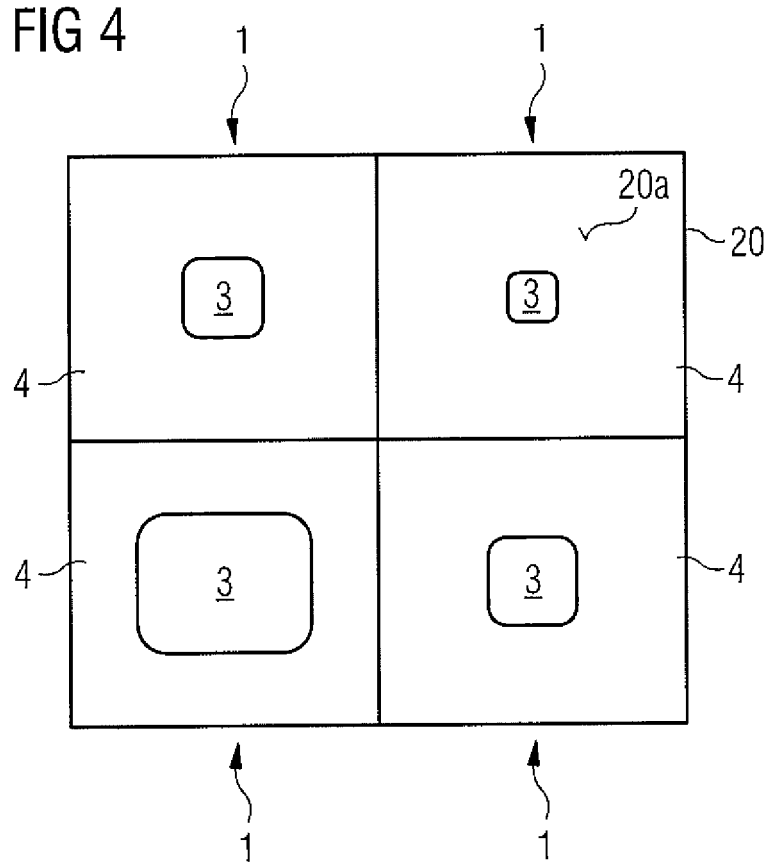

With reference to the schematic plan view in FIG. 4, a method described here is explained in greater detail.

Figure 5A:
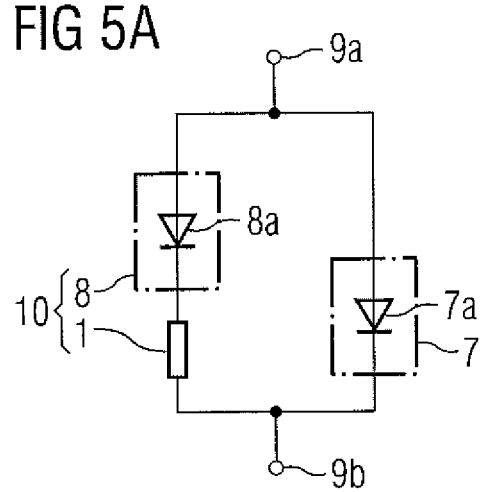
Figure 5B:
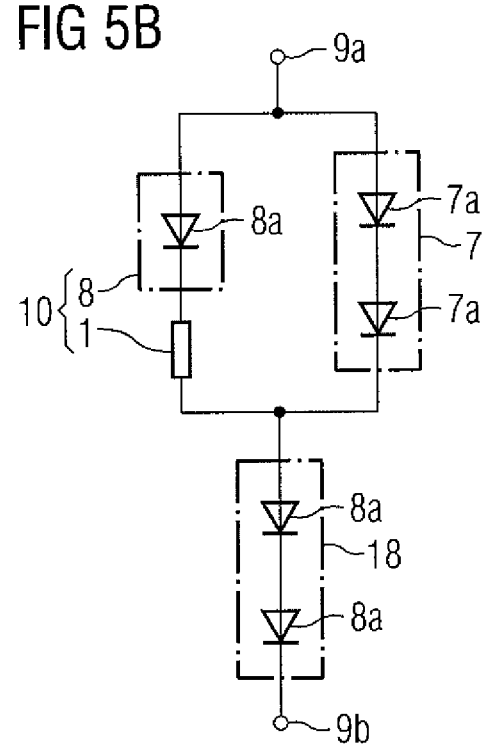

With reference to the schematic circuit diagrams in FIGS. 5A and 5B, exemplary embodiments of illumination devices described here are explained in greater detail.

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to better understanding.

DETAILED DESCRIPTION OF THE DRAWINGS

FIG. 1 shows a conventional resistance element 1 in a schematic sectional illustration. The resistance element 1 comprises a base body 2 formed with doped silicon. The base body 2 has a positive temperature coefficient of the resistance, that is to say that as the temperature increases, the resistance of the base body 2 also increases. The base body 2 has, for example, the shape of a cuboid or of a cylinder. A first contact element 5 is applied to the first main surface 2a of the base body 2. A second contact element 6 is applied to the second main surface 2b of the base body, said second main surface lying opposite the first main surface 2a.

The contact elements 5, 6 consist of an electrically conductive material, such as a metal, for example. By way of example, the contact elements 5, 6 contain gold and/or platinum. Furthermore, it is possible for the contact elements 5, 6 to consist of aluminum or to contain aluminum. Furthermore, the contact elements 5, 6 can be multilayer metallizations having, for example, the following layer sequences: Al/TiWN/Ti/Pt/Au or Al/Ti/Pt/Au.

The short-circuit path through the base body 2 between the first contact element 5 and the second contact element 6 has the length h, which is determined by the thickness d of the base body 2 in the present case. In order that the base body 2 is sufficiently stable mechanically, it should have a thickness of at least 100 µm, for example between 100 µm and 500 µm, by way of example between 100 µm and 200 µm. The resultant short-circuit path h is so large that—in order to keep the resistance of the resistance element in a range of between 3 and 10Ω—the doping of the base body 2 has to be chosen to be very high, for example greater than $10^{19}/cm^3$. However, this has the effect that the rise in resistance with temperature becomes too small to compensate for the power drop in comparison with red light-emitting diodes for example when using blue light-emitting diodes. Furthermore, the resistance value of the resistance element 1 in accordance with FIG. 1 can be set only by reducing the thickness of the base body with temperature coefficients remaining the same, such that it is not possible to produce different resistance elements with one wafer. Consequently, adapting the resistance to the use requirements is possible only poorly.

A first exemplary embodiment of a resistance element described here is explained in greater detail with reference to FIG. 2. In contrast to the resistance element in FIG. 1, in the case of the resistance element in FIG. 2, the electric current is not impressed into the base body 2 over the whole area via the first contact element 5, rather a passivation element 4 is situated between the base body 2 and the first contact element 5. The passivation element 4 is, for example, an electrically insulating layer composed of silicon dioxide or silicon nitride, into which an opening is introduced. A cutout 3 is situated below the opening, material of the base body 2 being removed in said cutout. In the present case, the cutout 3 is a drilled hole, for example, which is introduced into the base body 2 mechanically or by means of laser radiation. In the region of the cutout 3, the first contact element 5 is in electrical and direct contact with the base body 2. In this case, the cutout 3 has a side surface 3a and a bottom surface 3b, which are in each case completely covered by the first contact element 5. The distance between first contact element 5 and second contact element 6 at the second main surface 2b of the base body 2 can be set by means of the depth of the cutout 3, with thickness d of the base body 2 remaining the same. That is to say that, by means of the depth of the cutout, it is possible to set the short-current path h and hence the resistance value of the electric resistance element. Furthermore, the resistance can be set by means of the diameter of the cutout D. The greater the diameter D, the more current can flow by three-dimensional current transport through the base body 2.

The dopant concentration of the base body, which consists of silicon, for example, can be chosen on account of the cutout in the range of at most $10^{17}/cm^3$, wherein the thickness of the base body 2 can be chosen to have a magnitude of at least 100 μm, which ensures a sufficient mechanical stability of the resistance element 1. In the case of a temperature increase between 25° C. and 150° C., a factor of the resistance increase of >2 can be achieved, wherein resistance values of between at least 3 and at most 10Ω can be set by means of the depth of the cutout, that is to say the length of the short-circuit path h. The lateral dimensions L of the resistance element 1 are chosen, for example, such that the basic area thereof is at most 1 mm².

A further exemplary embodiment of a resistance element 1 described here is explained in greater detail in conjunction with the schematic sectional illustration in FIG. 3. In this exemplary embodiment, the cutout 3 is embodied in pyramid-shaped fashion. The first main surface 2a of the base body 2 is, for example, a silicon (100)-surface. The cutout 3 is produced by means of anisotropic etching, for example by wet-chemical etching by means of KOH. This gives rise to a pyramidal cutout having half an opening angle α of approximately 35.3°, which is predetermined by the silicon crystal structure. The etching process ends without external assistance as soon as the pyramid has formed, on account of the anisotropic etching. The length h of the short-circuit path between the first contact element 5, which is introduced into the cutout 3, and the second contact element 6 is determined by the distance between the vertex of the pyramid and the second main surface 2b of the base body 2. By means of the maximum diameter D of the, for example circular, opening in the passivation element 4, which also serves as an etching mask in the present case, it is possible to set the length h of the short-circuit path for a predetermined thickness d of the base body 2 in a simple manner. Particularly simple production of the resistance element 1 is therefore possible. The sole difficulty that arises is that, on account of the complex geometry of the cutout and thus of the contact area between first contact element 5 and base body 2, computer simulations or experiments are necessary to determine the maximum diameter D of the cutout 3, in order to set a predetermined resistance value.

A method described here for producing a multiplicity of resistance elements 1 is explained in greater detail with reference to the schematic plan view in FIG. 4. FIG. 4 shows in the plan view a small excerpt from a wafer 20. In this case, FIG. 4 shows four resistance elements 1, in which openings having a different diameter D are formed in the passivation element 4. On account of the openings of different sizes in the passivation element 4 serving as an etching mask, cutouts 3 having different maximum diameters D and different depths are produced by the etching process described above. In other words, on a single wafer it is possible to produce a plurality of resistance elements 1 which differ from one another with regard to their cutouts 3 and thus with regard to their resistance value. In this case, the thickness of the wafer and the dopant concentration are identical for all the resistance elements.

A first exemplary embodiment of an illumination device described here is explained in greater detail in conjunction with the schematic circuit diagram in FIG. 5A. The illumination device comprises a first arrangement 7 of light-emitting diodes, which comprises at least one light-emitting diode 7a of a first type. The light-emitting diode 7a is, for example, a light-emitting diode chip that emits red light. The light-emitting diode chip that emits red light has a relatively great temperature dependence of the intensity of the light emitted by it. Thus, the intensity of the emitted light decreases greatly as the temperature increases.

The illumination device furthermore comprises a second arrangement 8 of light-emitting diodes, which comprises at least one light-emitting diode 8a of a second type. The light-emitting diode 8a is, for example, a light-emitting diode that emits blue light and has a lower temperature sensitivity than the light-emitting diode of a first type 7a. In this case, a phosphor can be disposed downstream of the light-emitting diode 8a, such that the light-emitting diode emits white, green or yellow light. That is to say that the intensity of the light emitted by the light-emitting diode of a second type 8a decreases to a lesser extent than in the case of the light-emitting diode 7a of a first type as the temperature increases. A resistance element 1 described here, such as has been described for example in conjunction with FIGS. 2 and 3, is interconnected with the second arrangement 8 of light-emitting diodes to form a series circuit 10. The series circuit 10 is connected in parallel with the first arrangement of light-emitting diodes. The illumination device furthermore comprises first and second contact locations 9a, 9b.

The resistance element 1, on account of its positive temperature coefficient, now ensures that the decrease in intensity of the light-emitting diodes 7a of a first type as the temperature increases is compensated for by virtue of the fact that, as the temperature increases, more power is consumed at the resistance element 1 and thus less light is generated by the second arrangement 8 of light-emitting diodes of a second type. That is to say that, on account of the parallel circuit, the voltage at the second arrangement 8 of light-emitting diodes is higher and less current flows through the second arrangement 8, while a higher current flows through the first arrangement 7. Mixed light having a particularly constant color locus can be generated by the illumination device in this way.

With reference to FIG. 5b it is shown, by way of example, that the illumination device can be supplemented by further arrangements 18 of light-emitting diodes. By way of example, the further arrangement of light-emitting diodes 18 comprises light-emitting diodes of a second, first and/or a further type.

In the case of the illumination devices described here it is possible for the light-emitting diodes in the present case as light-emitting diode chips and also the resistance element to be arranged in a common housing, thus resulting in a particularly compact construction of the illumination device.

The invention is not restricted to the exemplary embodiments by the description on the basis of said exemplary embodiments. Rather, the invention encompasses any novel feature and also any combination of features which in particular includes any combination of features in the present claims, even if this feature or this combination itself is not explicitly specified in the patent claims or exemplary embodiments.

The invention claimed is:

1. An electric resistance element comprising:
    a base body, which is formed with a semiconductor material;
    a first contact element, which is electrically conductively connected to the base body; and
    a second contact element, which is electrically conductively connected to the base body,
    wherein the base body has a first main surface into which a cutout is introduced,
    wherein the first contact element is electrically conductively connected to the base body at least in places in the cutout,
    wherein the base body has a second main surface, which is arranged in a manner lying opposite the first main surface, and
    wherein the second contact element is electrically conductively connected to the base body at least in places at the second main surface.

2. The electric resistance element according to claim 1, wherein an electrically insulating passivation element is arranged between the first main surface and the first contact element.

3. The electric resistance element according to claim 1, wherein the first contact element and the base body are electrically conductively connected to one another only in the region of the cutout.

4. The electric resistance element according to claim 1,
    wherein the cutout has at least one side surface and at least one bottom surface;
    wherein the at least one side surface and the at least one bottom surface delimit the cutout toward the base body, and
    wherein the at least one side surface and the at least one bottom surface are completely in direct contact with the first contact element.

5. The electric resistance element according to claim 1, wherein the cutout is embodied in the manner of a pyramid whose vertex faces the second main surface.

6. The electric resistance element according to claim 1, wherein the cutout has traces of an etching process at its at least one side surface and its at least one bottom surface.

7. The electric resistance element according to claim 1 having a positive temperature coefficient.

8. The electric resistance element according to claim 1, wherein the base body consists of a doped silicon, and wherein the dopant concentration is at least $10^{15}$ cm$^{-3}$ and at most $10^{17}$ cm$^{-3}$.

9. The electric resistance element according to claim 1, wherein the base body has a thickness of at least 100 μm.

10. The electric resistance element according to claim 1, wherein the first main surface and/or the second main surface have/has a basic area of at most 1 mm$^2$.

11. An illumination device comprising:
    a first arrangement of light-emitting diodes, which comprises at least one light-emitting diode of a first type;
    a second arrangement of light-emitting diodes, which comprises at least one light-emitting diode of a second type; and
    a resistance element according to claim 1,
    wherein the light-emitting diodes of a first type have a different temperature dependence than the light-emitting diodes of a second type;
    wherein the resistance element and the second arrangement of light-emitting diodes form a series circuit; and
    wherein the series circuit and the first arrangement of light-emitting diodes form a parallel circuit.

* * * * *